(12) United States Patent
Albrecht et al.

(10) Patent No.: US 7,934,921 B2
(45) Date of Patent: May 3, 2011

(54) APPARATUS, SYSTEM, AND METHOD FOR GUIDED GROWTH OF PATTERNED MEDIA USING MONODISPERSE NANOSPHERES

(75) Inventors: Thomas R. Albrecht, San Jose, CA (US); Xing-Cai Guo, Tracy, CA (US); Bruno Marchon, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 710 days.

(21) Appl. No.: 11/932,608

(22) Filed: Oct. 31, 2007

(65) Prior Publication Data
US 2009/0109569 A1 Apr. 30, 2009

(51) Int. Cl.
B29C 59/00 (2006.01)
(52) U.S. Cl. ........................ 425/385; 264/293
(58) Field of Classification Search ............... 425/385, 425/810; 264/293
See application file for complete search history.

(56) References Cited

U.S. PATENT DOCUMENTS

| | | | | |
|---|---|---|---|---|
| 5,817,173 | A | 10/1998 | Nakata | 117/73 |
| 5,885,869 | A | 3/1999 | Turner et al. | 438/261 |
| 6,033,928 | A | 3/2000 | Eriguchi et al. | 438/42 |
| 6,530,554 | B2 * | 3/2003 | Shimmo et al. | 249/115 |
| 6,753,130 | B1 | 6/2004 | Liu et al. | 430/313 |
| 6,924,921 | B2 | 8/2005 | Lewis, III et al. | 359/296 |
| 7,045,195 | B2 | 5/2006 | Ozin et al. | 428/173 |
| 7,098,056 | B2 | 8/2006 | Demers | 438/20 |
| 2002/0171026 | A1 | 11/2002 | Kuroda | 249/114.1 |
| 2004/0084749 | A1 | 5/2004 | Pamler et al. | 257/522 |
| 2006/0131261 | A1 | 6/2006 | Green | 216/17 |
| 2006/0145136 | A1 | 7/2006 | Verhoeven | 257/14 |
| 2006/0286368 | A1 | 12/2006 | Albrecht et al. | 428/332 |

FOREIGN PATENT DOCUMENTS

KR 20010008604 2/2001

OTHER PUBLICATIONS

Yan et al., "Nanosphere Lithography from Template-Directed Colloidal Sphere Assemblies", Journal of Nanoscience and Nanotechnology vol. 6, 1815-1818, 2006.

Shin et al., "Optical Properties of a SiO2 Phonotic Crystal Layer Fabricated by Seeded Growth of Spherical Nanopartical", Proc of SPIE vol. 5733, 2005.

(Continued)

*Primary Examiner* — Maria Veronica D Ewald
(74) *Attorney, Agent, or Firm* — Kunzler Needham Massey & Thorpe (57) ABSTRACT

An apparatus, system, and method are disclosed for guided growth of patterned media using monodisperse nanospheres. The apparatus includes nanoscale features extending from a substrate. The nanoscale features may be formed using electron-beam lithography and have a non-uniform cap. A spherical cap is formed on the non-uniform cap by hydrolysis and precipitation of monodisperse nanospheres on an immobilized nucleation site, the immobilized nucleation site attached with one end of the nanoscale feature. The system includes the apparatus and further includes monodisperse nanospheres formed of silicon dioxide spheres. The method includes providing a substrate, etching at least one nanoscale feature extending from the substrate, the feature formed using electron-beam lithography and having a non-uniform cap, forming an immobilized nucleation site, and forming a spherical cap by hydrolysis and precipitation of monodisperse nanospheres on the immobilized nucleation site, the immobilized nucleation site attached with one end of the nanoscale feature.

14 Claims, 6 Drawing Sheets

OTHER PUBLICATIONS

Zhou et al., "Surface Patterning with Carbon Thin Films by Nanosphere Lithography", Surface & Coatings Technology 198, p. 178-183, 2005.

Stenger et al., "Template-Directed Self-Organized Silica Beads on Square and Penrose-Like Patterns", Journal of Luminescense 121, p. 278-281, 2006.

* cited by examiner

APPARATUS, SYSTEM, AND METHOD FOR GUIDED GROWTH OF PATTERNED MEDIA USING MONODISPERSE NANOSPHERES

BACKGROUND OF THE INVENTION

1. Field of the Invention

This invention relates to patterned media on hard disk drives and more particularly relates to guided growth of patterned media using monodisperse nanospheres.

2. Description of the Related Art

Hard-disk drives have rotating high precision aluminum or glass disks that are coated on both sides with a special thin film media designed to store information in the form of magnetic patterns. Electromagnetic read/write heads suspended or floating only fractions of micro inches above the disk are used to either record information onto the thin film media, or read information from it.

A read/write head may write information to the disk by creating an electromagnetic field to orient a cluster of magnetic grains in one direction or the other. Each grain will be a magnetic dipole pointing in a certain direction and also creating a magnetic field around the grain. All of the grains in a magnetic region typically point in the same direction so that the magnetic region as a whole has an associated magnetic field. The read/write head writes regions of + and − magnetic polarity, and the timing of the boundaries between regions of opposite polarity (referred to as "magnetic transitions") is used to encode the data. To increase the capacity of disk drives, manufacturers are continually striving to reduce the size of the grains.

The ability of individual magnetic grains to be magnetized in one direction or the other, however, poses problems where grains are extremely small. The superparamagnetic effect results when the product of a grain's volume (V) and its anisotropy energy ($K_u$) fall below a certain value such that the magnetization of that grain may flip spontaneously due to thermal excitations. Where this occurs, data stored on the disk is corrupted. Thus, while it is desirable to make smaller grains to support higher density recording with less noise, grain miniaturization is inherently limited by the superparamagnetic effect.

In response to this problem, engineers have developed patterned media, where the magnetic thin film layer is created as an ordered array of highly uniform pillars, each pillar capable of storing an individual bit. Each bit may be one grain, or several exchange coupled grains, rather than a collection of random decoupled grains. In this manner, patterned media effectively reduces noise by imposing sharp magnetic transitions at well-defined pre-patterned positions, known as bit patterns. Bit patterns are organized as concentric data tracks around a disk.

One benefit of patterned media is the ability to overcome the above described superparamagnetic effect. Due to their physical separation and reduced magnetic coupling to one another, the magnetic pillars function as individual magnetic units, comprised either of single grains or a collection of strongly-coupled grains within each pillar. Since these magnetic pillars are typically larger than the individual grains in conventional media, their magnetization is thermally stable.

Conceptually, patterned media is a simple concept, however, mass producing disks at a reasonable cost is an immense challenge. To generate pillars or features required for the ever increasing data density, two approaches are taken: electron-beam lithography and nanoimprint replication. The main advantage of electron beam lithography, or e-beam lithography, over traditional photolithography is the ability of e-beam lithography to create nanometer-scale features. Traditional photolithography is limited because of the diffraction limit of light.

Unfortunately, e-beam lithography is a serial process, meaning that the e-beam must be scanned across the surface to be patterned. Therefore, e-beam lithography is not suitable for mass production. To overcome this limitation, a "master" disk is prepared by e-beam lithography and used to imprint "daughter" disks with nanometer scale features (hence (hence nanoimprinting).

E-beam lithography is capable of creating features having dimensions on the order of a few nanometers. However, the practical resolution of an e-beam generated feature is limited by forward scattering in the resist, backward scattering, and secondary electron travel in the resist. Each of the above can lead to a degradation of the resist and in some cases a complete removal of resist in the desired pattern area, and an uneven surface results.

Unfortunately, the uneven surface of the feature can affect the strength of the magnetic field of the feature. What is needed is a method for producing a smooth substrate utilizing e-beam lithography.

SUMMARY OF THE INVENTION

The present invention has been developed in response to the present state of the art, and in particular, in response to the problems and needs in the art that have not yet been fully solved by currently available patterned media devices. Accordingly, the present invention has been developed to provide an apparatus, system, and method for guided growth of patterned media that overcome many or all of the above-discussed shortcomings in the art.

The apparatus, in one embodiment, includes a substrate, at least one nanoscale feature extending from the substrate, the feature formed using electron-beam lithography and having a non-uniform cap, wherein the non-uniform cap is an immobilized nucleation site, and a spherical cap formed by hydrolysis and precipitation of monodisperse nanospheres on the immobilized nucleation site, the immobilized nucleation site attached with one end of the nanoscale feature.

In one embodiment, the monodisperse nanospheres comprise silicon dioxide spheres formed from hydrolysis of tetraethyl orthosilicate (TEOS). The hydrolysis of TEOS further comprises controlled addition of TEOS to a solution of about 2M $NH_3$ and 6M $H_2O$. Furthermore, the solution has a pH in the range of between about 8 and 13, and a temperature in the range of between about 20 degrees C. and 80 degrees C.

A system of the present invention is also presented for guided growth of patterned media. In particular, the system, in one embodiment, includes a substrate, and at least one nanoscale feature extending from the substrate. The nanoscale feature may be formed using electron-beam lithography, and have a non-uniform cap. The non-uniform cap is an immobilized nucleation site where a spherical cap may be formed by hydrolysis and precipitation of monodisperse nanospheres. The monodisperse nanospheres may comprise silicon dioxide spheres formed from hydrolysis of tetraethyl orthosilicate in a solution comprising 2M $NH_3$ and 6M $H_2O$, a pH in the range of between about 8 and 13, and a temperature in the range of between about 20 degrees C. and 80 degrees C.

A method of the present invention is also presented for controlling growth of patterned media. The method in the disclosed embodiments substantially includes the steps necessary to carry out the functions presented above with respect to the operation of the described apparatus and system. In one embodiment, the method includes providing a substrate, etching at least one nanoscale feature extending from the substrate, the feature formed using electron-beam lithography and having a non-uniform cap, forming an immobilized nucleation site, forming a spherical cap by hydrolysis and precipitation of monodisperse nanospheres on the immobilized nucleation site, the immobilized nucleation site attached with one end of the nanoscale feature.

The method also includes hydrolysing of tetraethyl orthosilicate (TEOS), controlled adding of TEOS to a solution of about 2M $NH_3$ and 6M $H_2O$, and maintaining the pH of the solution in the range of between about 8 and 13. In a further embodiment, the method includes maintaining the temperature of the solution in the range of between about 20 degrees C. and 80 degrees C., and forming a secondary patterned substrate comprising a flexible acrylate imprinting apparatus. Additionally, the method includes transmitting UV light into a UV-curable liquid resist on a surface of a disk substrate.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
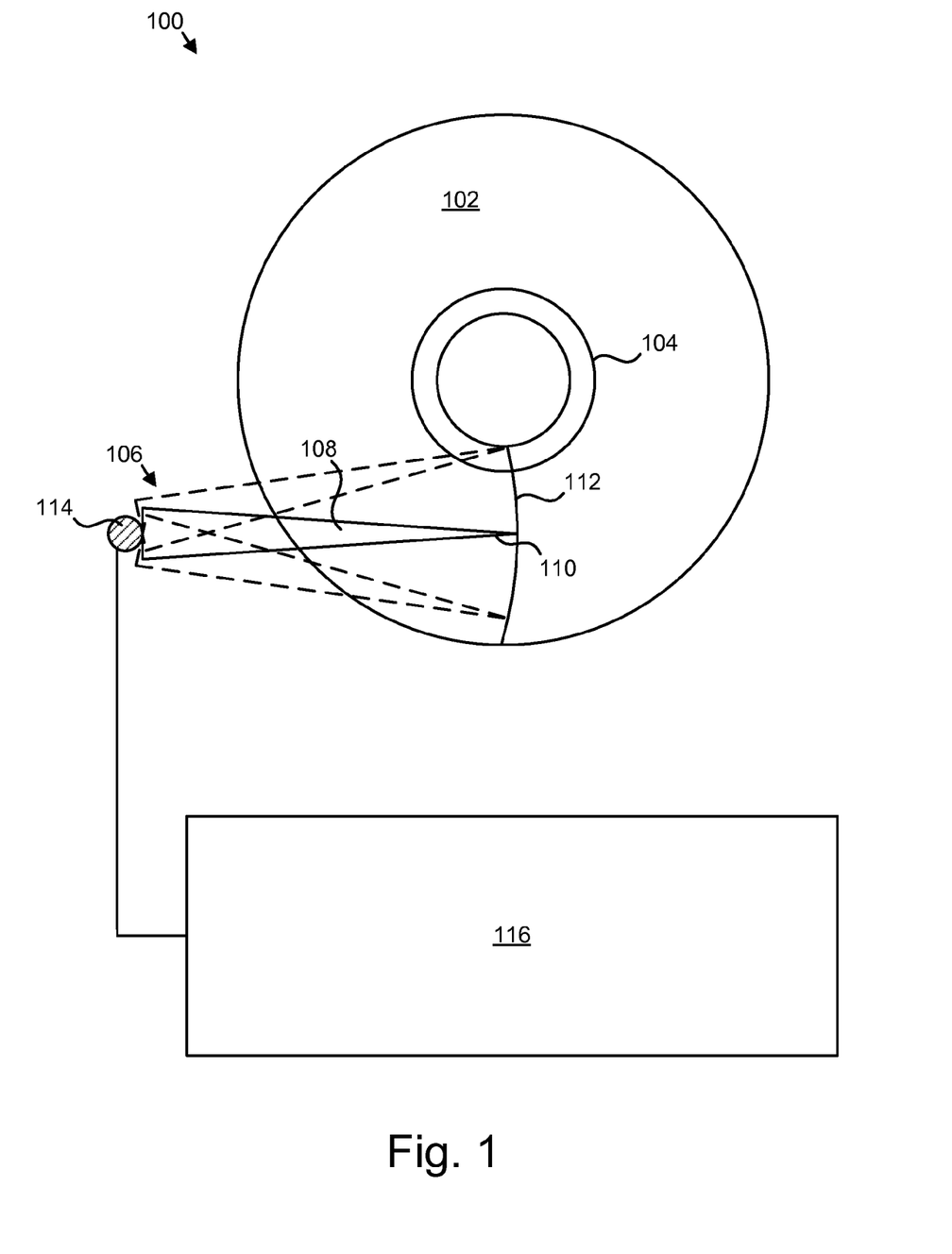
FIG. 1 is a schematic block diagram illustrating a hard-disk drive assembly in accordance with the present invention.

FIG. 1 is a schematic block diagram illustrating a hard-disk drive assembly 100 in accordance with the present invention. A hard-disk drive assembly 100 generally comprises at least one of hard disk 102, rotated at high speeds by a spindle motor (not shown) during operation. Concentric data tracks 104 formed on either or both disk surfaces receive and store magnetic information.

A read/write head 110 may be moved across the disk surface by an actuator assembly 106, allowing the head 110 to read or write magnetic data to a particular track 104. The actuator assembly 106 may pivot on a pivot 114. The actuator assembly 106 may form part of a closed loop feedback system, known as servo control, which dynamically positions the read/write head 110 to compensate for thermal expansion of the disks 102 as well as vibrations and other disturbances. Also involved in the servo control system is a complex computational algorithm executed by a control module 116. The control module may comprise a microprocessor, digital signal processor, or analog signal processor that receives data address information from an associated computer, converts it to a location on a disk 102, and moves the read/write head 110 accordingly.

Specifically, read/write heads 110 periodically reference servo patterns recorded on the disk to ensure accurate head 110 positioning. Servo patterns may be used to ensure a read/write head 110 follows a particular track accurately, and to control and monitor transition of the head 110 from one track 104 to another. Upon referencing a servo pattern, the read/write head 110 obtains head position information that enables the control module 116 to subsequently re-align the head 110 to correct any detected error.

Servo patterns may be contained in engineered servo sectors 112 embedded within a plurality of data tracks 104 to allow frequent sampling of the servo patterns for optimum disk drive performance. In a typical hard disk 102, embedded servo sectors 112 extend substantially radially from the disk 102 center, like spokes from the center of a wheel. Unlike spokes however, servo sectors 112 form a subtly arc-shaped path calibrated to substantially match the range of motion of the read/write head 110.

Figure 2A:
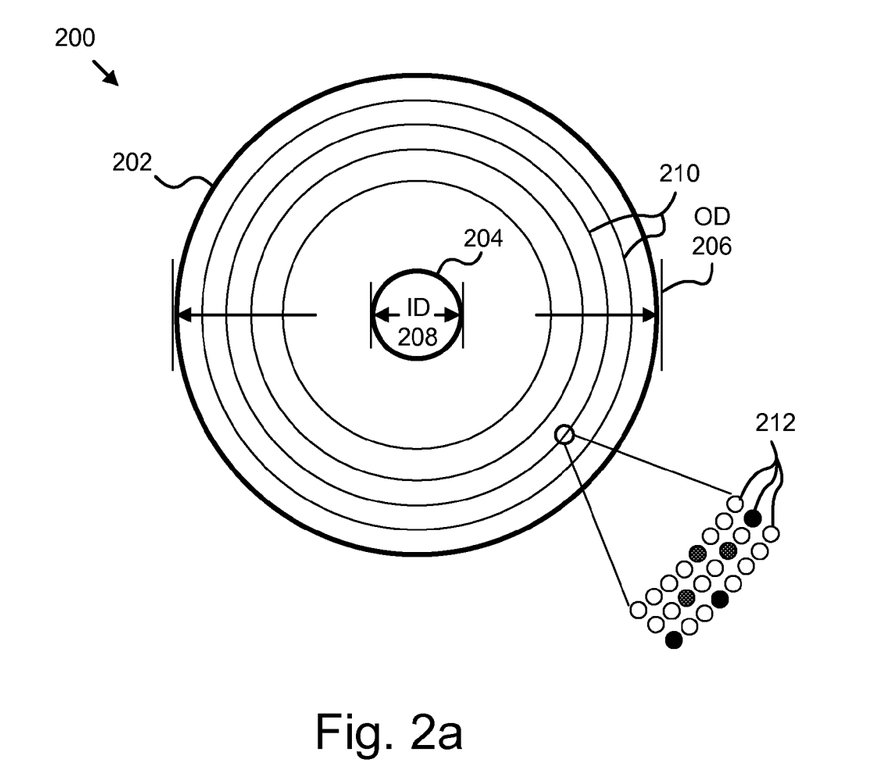
FIG. 2a is a schematic block diagram illustrating a plan view of a disk containing patterned magnetic media in accordance with the present invention.

FIG. 2a is a schematic block diagram illustrating a plan view of a disk 200 containing patterned magnetic media in accordance with the present invention. The disk 200 includes a circular outside edge 202, a central opening 204, an outside diameter (OD) 206, an inside diameter (ID) 208, tracks 210, and data recording bits 212.

Each track 210, which is a ring on the disk 200 where data can be written, is used to identify where information is stored. A track 210 of patterned magnetic media generally comprises a number of highly uniform pillars 212. Each pillar is capable of storing an individual data recording bit that corresponds to a binary digit.

Electromagnetic read/write heads suspended or floating only fractions of micro inches above the disk 200 are used to either record information onto a magnetic layer or read information from it. In certain embodiments, the read/write head flies just a few nanometers above the surface of the disk 200. Consequently, precision and substrate integrity are essential to achieve quality data throughput.

A read/write head may write information to the disk 200 by creating an electromagnetic field to orient a bit on a pillar 212, in one direction or the other. To read information, magnetic patterns detected by the read/write head are converted into a series of pulses which are sent to the control module 116 to be converted to binary data and processed by an attached computing system (not shown).

Patterned media with isolated pillars 212 enables the bit size to be reduced without causing instability known as the superparamagnetic effect. In conventional multigrain magnetic media, for example, bits are generally created by covering a flat substrate with a thin layer of magnetic alloy, which comprises formed clusters of atoms on the substrate surface known as grains. Each grain operates as a partially independent unit of magnetization subject to influence from other grains. Data stored in tracks 210 is comprised of regions of alternating magnetic polarity.

Manufacturers of conventional hard disk drives employ many tactics to increase storage density. For example, tracks may be made narrower, or the length of the regions of alternating polarity along the track may be reduced. Shrinking these dimensions generally requires that the size of the random grains in the media be reduced, so that sharp boundaries and sharp track edge boundaries can be defined by the magnetic write head. If grains are too large, the signal to noise ratio of the recording system suffers, and data errors are generated at an unacceptable rate. On the other hand, if the grains are too small, they may become unstable from thermally induced vibrations and spontaneously reverse their magnetic polarity (leading to loss of stored data). As a result of the superparamagnetic effect, the areal density of stable conventional hard disk drives has typically been restricted to around 150 Gbit/in$^2$ for conventional multigrain magnetic recording media.

One benefit of patterned media is the ability to overcome the above described superparamagnetic effect. Forming pillars 212 on the substrate of the disk 200 increases the storage capacity and reduces the risk of losing data due to magnetic grain instability.

Due to their physical separation and reduced magnetic coupling to one another, the magnetic pillars 212 function as individual magnetic units, comprised either of single grains or a collection of strongly-coupled grains within each pillar. Since these magnetic pillars 212 are typically larger than the individual grains in conventional media, their magnetization is thermally stable.

Figure 2B:
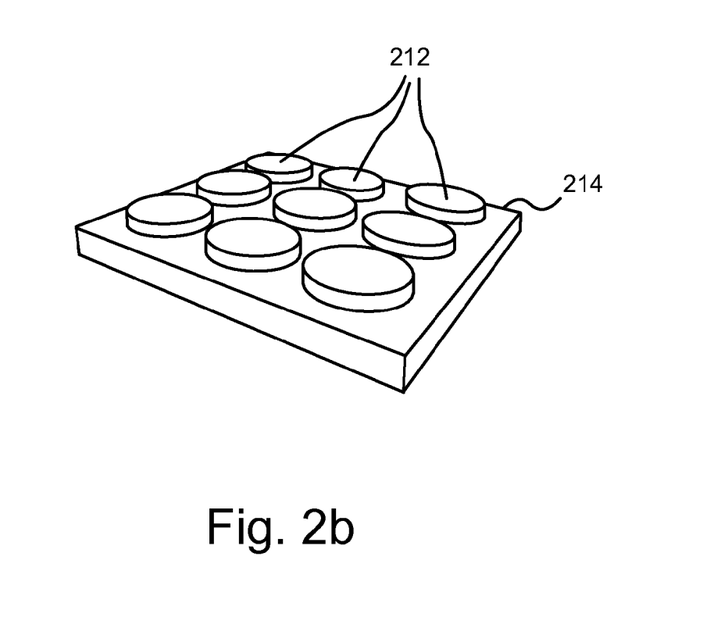
FIG. 2b is a perspective view diagram illustrating a plurality of pillars in accordance with the present invention.

FIG. 2b is a perspective view diagram illustrating a plurality of pillars 212 in accordance with the present invention. As used herein, the term "pillar" refers to an isolated magnetic region. The "pillars," in addition to comprising an isolated magnetic region, may also have a physical appearance that is similar to a pillar. For example, in one embodiment, the pillars 212 may protrude outward from the substrate 214. As described above, each pillar 212 in one embodiment is configured to store one data recording bit.

Figure 3:
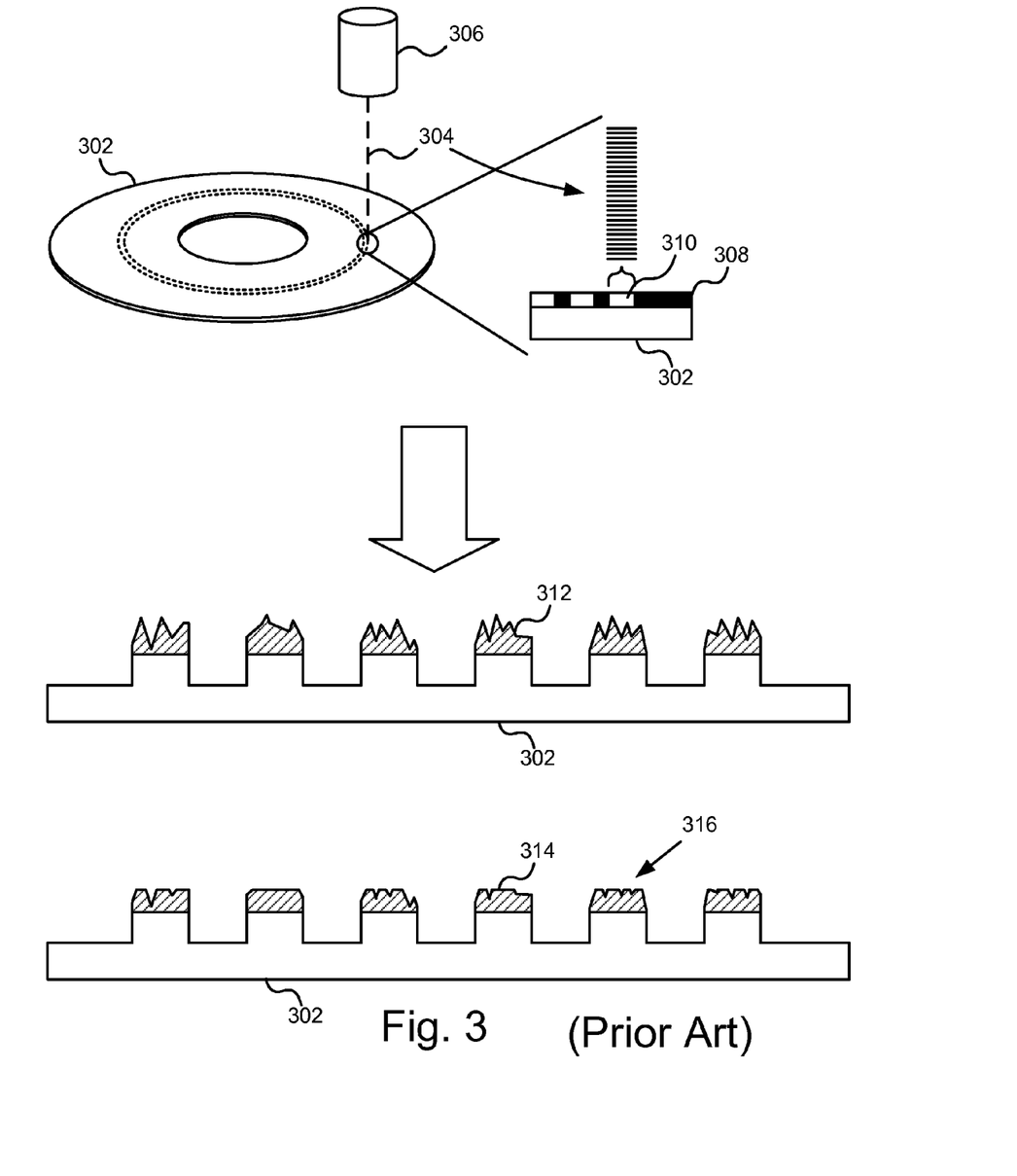
FIG. 3 is a perspective view diagram and a cross-section view diagram illustrating one embodiment of the various stages of a substrate during the manufacturing of pillars in accordance with the prior art.

FIG. 3 is a diagram illustrating one embodiment of the various stages of a substrate 302 during the manufacturing of pillars in accordance with the prior art. The substrate 302, depicted here as a disk, is covered with a layer of resist 308 and subjected to an electron-beam 304 from an electron-beam source 306. The electron-beam 304 is controlled in a way to only expose dots 310. After developing, this patterned resist becomes a mask for etching a pattern of holes into the surface of the substrate 302.

This process, known as electron beam lithography, is well known to those skilled in the art of forming micro- and nano-scale features using lithography. The main advantage of electron beam lithography, or e-beam lithography, over traditional photolithography is the ability of e-beam lithography to create nanometer-scale features. Traditional photolithography is limited because of the diffraction limit of light.

However, e-beam lithography is a serial process, meaning that the e-beam must be scanned across the surface to be patterned. Therefore, e-beam lithography is not suitable for mass production. To overcome this limitation, a "master" disk is prepared by e-beam lithography and used to imprint "daughter" disks. Therefore, this substrate 302 may be used as the master, or stamper, in a process referred to as nanoimprint replication. Nanoimprint replication is a method of stamping a nanometer (nm) scale resist pattern on a disk for subsequent etching steps.

E-beam lithography is capable of creating features having dimensions on the order of a few nanometers. However, the practical resolution of an e-beam generated feature is limited by forward scattering in the resist, backward scattering, and secondary electron travel in the resist. Each of the above can lead to a degradation of the resist and in some cases a complete removal of resist in the desired pattern area. Once etched, this leads to a non-uniform pillar 312. In fact, the pillars 312 may appear very jagged.

The pillars 312, in an attempt to overcome the unevenness, may be burnished (similar to polishing) or flattened. An example of a burnished pillar is illustrated as pillar 314 of FIG. 3. The cap 316 of the pillar 314, which may be formed of a different material than the substrate 302, can only be burnished to a certain point before risking the complete removal of the cap 316. As a consequence, a certain amount of jaggedness is accepted. Unfortunately, the uneven surface of the pillar 314 affects the strength of the magnetic field of the pillar.

Figure 4:
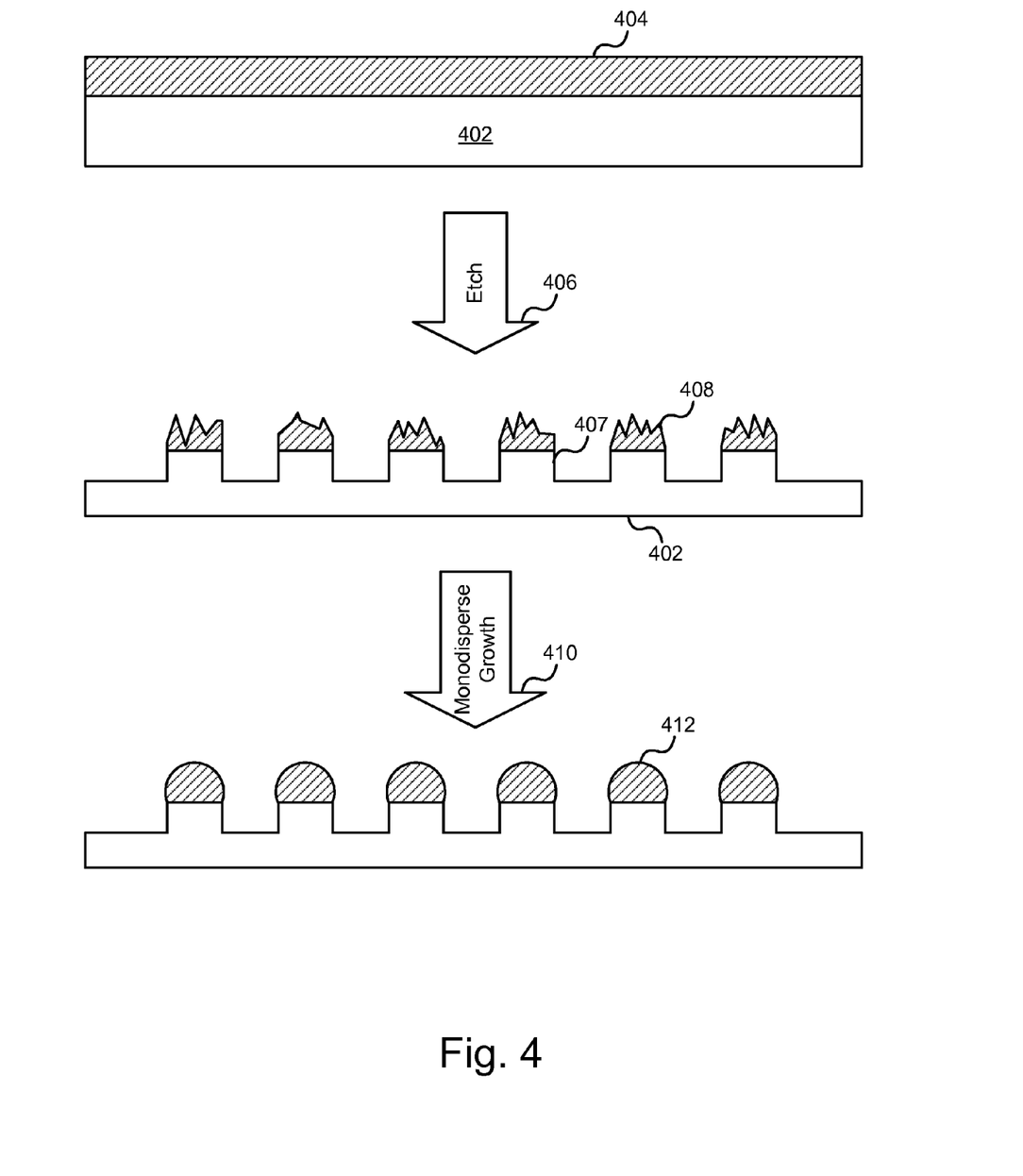
FIG. 4 is a cross-section view diagram illustrating one embodiment of the various stages of a substrate during the manufacturing of pillars in accordance with the present invention.

FIG. 4 is a diagram illustrating one embodiment of the various stages of a substrate 402 during the manufacturing of pillars in accordance with the present invention. FIG. 4 illustrates a cross-sectional view of the substrate 402 having a cap 404. In one embodiment, the substrate 402 may be a silicon based material having a silicon dioxide cap 404. Following the etching process (indicated by arrow 406) as described above, the substrate 402 comprises a plurality of pillars 407 having jagged caps 408.

The present invention includes a method of "smoothing" the caps 408. Smoothed caps 408 are achieved using guided growth 410 of monodisperse nanospheres. As used herein, the term "monodisperse" refers to spheres of a uniform size in a dispersed phase, where the difference in diameter of the spheres is, on average, =<5%. As used herein, the term "nanospheres" refers to spheres having a diameter in the range of between about 1 nm and 1 µm. Monodisperse spheres having a diameter in the range from 10 nm to 1 µm are prepared by sol-gel reactions using tetraethyl orthosilicate (TEOS) as a silica precursor in alcoholic solutions. The formation of the spheres proceeds as follows:

$$Si(OC_2H_5)_4 + 4H_2O \rightarrow Si(OH)_4 + 4C_2H_5OH \quad (1)$$

$$Si(OH)_4 \rightarrow SiO_2(s) + 2H_2O \quad (2)$$

Hydrolysis (equation 1) and precipitation (equation 2) of the monomers are catalyzed by ammonia, which also provides the particles with a negative stabilizing surface charge. The precipitation reaction involves two sequential steps: nucleation and growth of the nuclei. To achieve monodispersity, the two steps are separated and nucleation is avoided during the period of growth. The precursor (TEOS) is added slowly at a well-controlled rate to maintain a sub-supersaturation level during growth. The uniformity in size for spheres is achieved through a "self-sharpening" growth process where smaller particles grow more rapidly than larger ones. Regardless of the initial shape of the nuclei, the final shape is always spherical due to the natural tendency to minimize surface energy.

By immersing the substrate 402 in the alcoholic solution, the ragged (or non-uniform) silicon dioxide caps 408 act as immobilized nuclei in the seeded growth of monodisperse silica spheres. The reaction described above requires nucleation sites for the silicon dioxide to precipitate. In one embodiment, the ragged caps 408 provide the nucleation sites. However, the ragged caps 408 are "immobilized" in the sense that the position of each cap 408 is fixed with regard to the substrate. Conversely, suspended (floating) particles are "mobile" nucleation sites.

Uniform spherical caps 412 form on the caps 408. The growth rate of the caps 412 is finely controlled by the addition rate and concentration of TEOS monomer solution. The growth, additionally, can be terminated when a satisfactory final pillar size is reached. The control of growth rate as a result of TEOS concentration is within the skill of one of ordinary skill in the art.

Other factors that enable the guided growth include the amount of TEOS in the alcohol solution, the temperature of the solution, and the pH of the solution. In one prophetic example, guided growth of monodisperse nanospheres is achieved with a solution of 2M $NH_3$ and 6M $H_2O$ having a pH in the range of 8 to 13. TEOS is continuously fed into the solution having a temperature in the range of between about 20 and 80 degrees C. The spherically capped pillars 412 may undergo a thermal treatment at approximately 150 degrees C. in order to release absorbed water. Furthermore, the pillars 412 may be coated with a ceramic material, such as silicon nitride, in order to strengthen the pillars 412.

Figure 5:
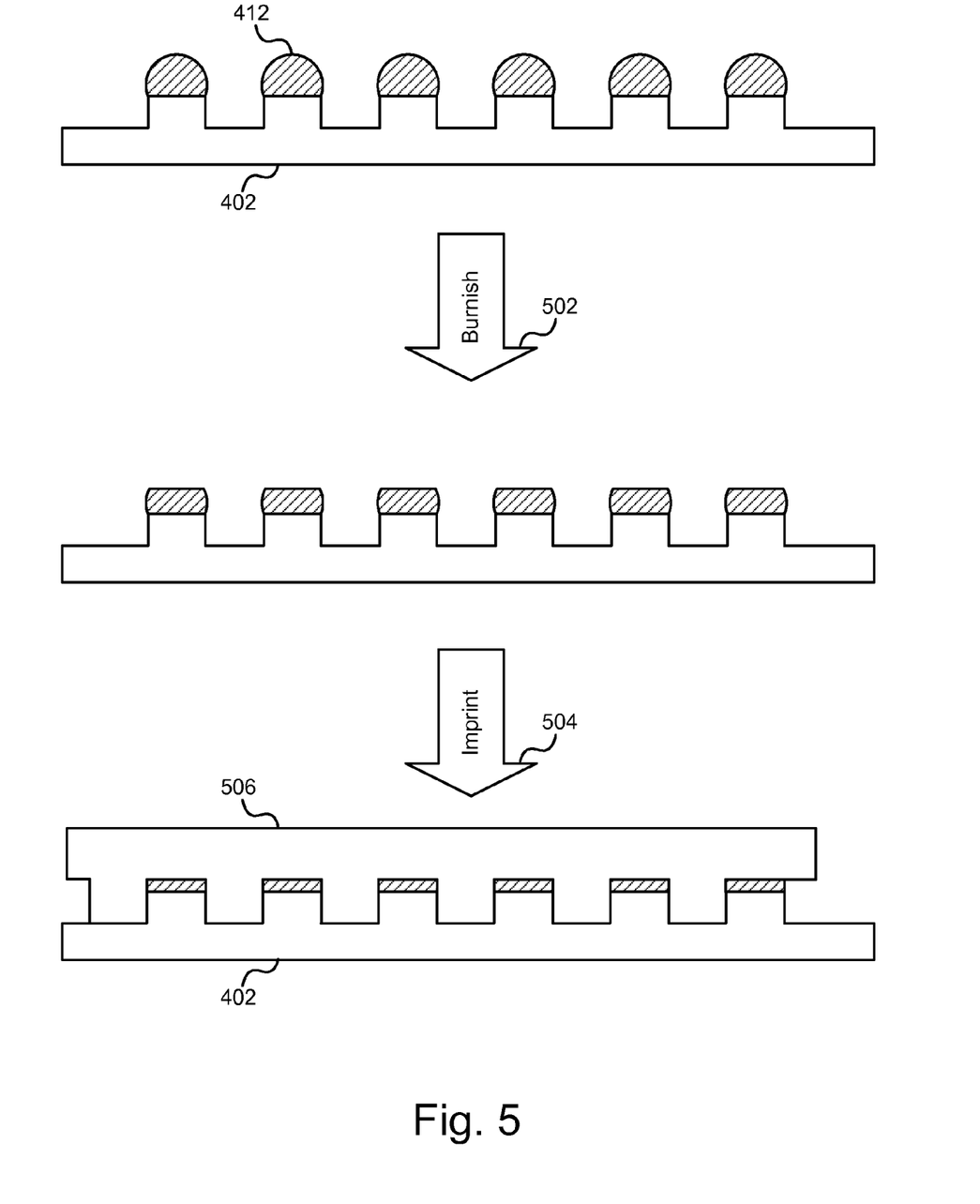
FIG. 5 is a cross-section view diagram illustrating another embodiment of the various stages of a substrate during the manufacturing of pillars in accordance with the present invention.

FIG. 5 is a diagram illustrating another embodiment of the various stages of a substrate 402 during the manufacturing of pillars in accordance with the present invention. In one embodiment, the substrate 402 having pillars 412 as illustrated in FIG. 4 is now ready to "stamp" the etched pattern of pillars into an acrylate-based stamper. The substrate 402, often referred to as the "master," may alternatively be burnished 502 in order to flatten the spherical caps.

In order to preserve the master 402, a secondary patterned substrate 506 may be formed from the master 402. The secondary patterned substrate 506 (hereinafter "daughter") may be formed of a flexible or rigid plastic material, including, but not limited to, acrylate-based materials.

The daughter 506 is then used to imprint the features onto a disk substrate, for example. In one embodiment, a thin layer of UV-curable liquid resist is coated on the disk substrate, and the daughter 506 is pressed into the resist layer. While the daughter 506 is in contact with the disk substrate, UV light is projected through the daughter 506 which polymerizes the resist, hardening the resist into a mask for etching pillars on the disk surface. In the event this disk substrate is to be used in a magnetic data recording device such as a hard drive, a magnetic layer may be sputtered onto the resulting, etched substrate.

The method taught above for producing smooth nano-features applies to other shapes besides pillars, and may be implemented in the manufacture of other devices, for example in the manufacture of DTM (discrete track media), MEMS (micro electro-mechanical system), or other nanometer-sized devices in nanotech industries.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 6:
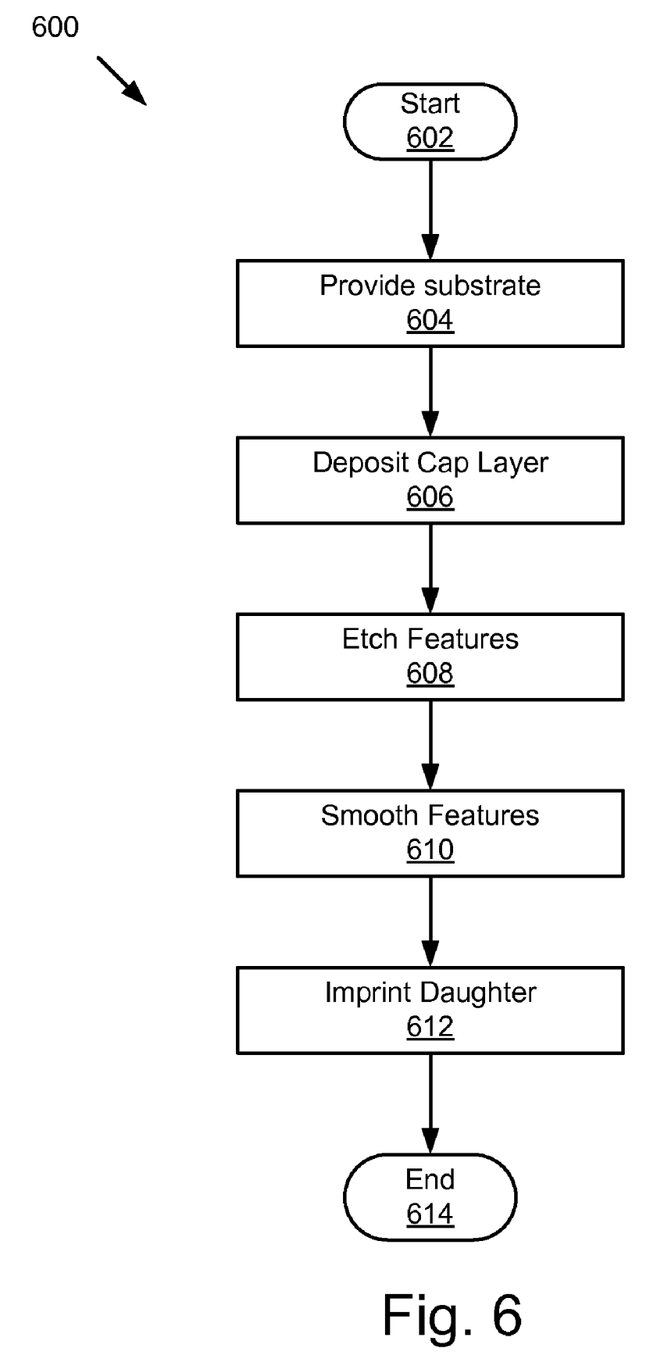
FIG. 6 is a schematic flow chart diagram illustrating one embodiment of a method for manufacturing patterned media in accordance with the present invention.

FIG. 6 is a schematic flow chart diagram illustrating one embodiment of a method 600 for manufacturing patterned media in accordance with the present invention. In one embodiment, the method 600 starts 602 and a substrate is provided 604. The substrate may be formed of silicon, but may be formed of silicon-based materials, gallium-based materials, etc. A cap layer may be deposited 606 by sputtering, for example, silicon dioxide. The material of the cap is chosen according to the precursor that will be used for smoothing the cap. In one instance, silicon dioxide is selected and deposited 606 because the precursor TEOS converts into silicon dioxide.

Features, such as pillars, are etched 608 using e-beam lithography as described above with reference to FIGS. 2 and 3. The features are then smoothed 610 in accordance with the description of FIG. 4. The method continues and the etched substrate imprints 612 the daughter. The method 600 then ends 614.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for imprinting patterned recording media, the apparatus comprising:
   a substrate;
   at least one nanoscale feature extending from the substrate;
   a non-uniform cap formed on the at least one nanoscale feature, the non-uniform cap comprising a non-uniform surface, wherein the non-uniform surface of the non-uniform cap comprises an immobilized nucleation site; and
   a spherical cap comprising monodisperse nanospheres formed on the immobilized nucleation site, the immobilized nucleation site disposed between the nanoscale feature and the spherical cap.

2. The apparatus of claim 1, wherein the monodisperse nanospheres comprise silicon dioxide spheres.

3. The apparatus of claim 1, further comprising a secondary patterned substrate comprising a flexible acrylate imprinting apparatus.

4. The apparatus of claim 3, wherein the secondary patterned substrate is a replica of the apparatus and transmits UV light into a UV-curable liquid resist on a surface of a disk substrate.

5. A system for imprinting patterned recording media, the system comprising:
   a substrate;
   at least one nanoscale feature extending from the substrate;
   a non-uniform cap formed on the at least one nanoscale feature, the non-uniform cap comprising a non-uniform surface, wherein the non-uniform surface of the non-uniform cap comprises an immobilized nucleation site; and
   a spherical cap comprising monodisperse nanospheres formed on the immobilized nucleation site, the immobilized nucleation site disposed between the nanoscale feature and the spherical cap; and
   wherein the monodisperse nanospheres comprise silicon dioxide spheres.

6. The system of claim 5, further comprising a secondary patterned substrate comprising a flexible acrylate imprinting apparatus.

7. The system of claim 6, wherein the secondary patterned substrate is a replica of the apparatus and configured to transmit UV light into a UV-curable liquid resist on a surface of a disk substrate.

8. An apparatus for imprinting patterned recording media formed by the process comprising:
   providing a substrate;
   etching, using electron-beam lithography, at least one nanoscale feature extending from the substrate and a non-uniform cap on the at least one nanoscale feature, the non-uniform cap comprising a non-uniform surface;
   forming an immobilized nucleation site on the non-uniform surface; and
   forming a spherical cap comprising monodisperse nanospheres by hydrolysis and precipitation of the monodisperse nanospheres on the immobilized nucleation site, the immobilized nucleation site disposed between the nanoscale feature and the spherical cap.

9. The apparatus of claim 8, wherein forming the monodisperse nanospheres further comprises hydrolysis of tetraethyl orthosilicate (TEOS).

10. The apparatus of claim 9, further comprising controlled addition of TEOS to a solution of about 2M $NH_3$ and 6M $H_2O$.

11. The apparatus of claim 9, further comprising maintaining the pH of the solution in the range of between about 8 and 13.

12. The apparatus of claim 9, further comprising maintaining the temperature of the solution in the range of between about 20 degrees C. and 80 degrees C.

13. The apparatus of claim 8, further comprising forming a secondary patterned substrate comprising a flexible acrylate imprinting apparatus.

14. The apparatus of claim 13, further comprising transmitting UV light into a UV-curable liquid resist on a surface of a disk substrate.

\* \* \* \* \*